United States Patent [19]
Lee et al.

[11] Patent Number: 6,157,557
[45] Date of Patent: Dec. 5, 2000

[54] CAM CELL AND MEMORY EMPLOYING SUCH, USED FOR BOTH FIELD CONFIGURABLE RAM AND PLA

[75] Inventors: Kwi-Ro Lee; Sang-Sik Yoon, both of Taejon-si, Rep. of Korea

[73] Assignee: Korea Advanced Institute of Science and Technology, Rep. of Korea

[21] Appl. No.: 09/222,390

[22] Filed: Dec. 29, 1998

[30] Foreign Application Priority Data

Feb. 26, 1998 [KR]  Rep. of Korea .................... 98-6277

[51] Int. Cl.[7] ................................................. G11C 15/00
[52] U.S. Cl. .................................................. 365/49; 326/44
[58] Field of Search ....................... 365/49, 190; 326/44

[56] References Cited

U.S. PATENT DOCUMENTS

| | | |
|---|---|---|
| 5,408,434 | 4/1995 | Stansfield . |
| 5,422,838 | 6/1995 | Lin ............................................. 365/49 |
| 5,659,697 | 8/1997 | Dietz ......................................... 365/49 |
| 5,905,668 | 5/1999 | Takahashi et al. ........................ 365/49 |
| 6,005,790 | 12/1999 | Chan et al. ............................... 365/49 |

*Primary Examiner*—Richard Elms
*Assistant Examiner*—Vanthu Nguyen
*Attorney, Agent, or Firm*—Bachman & LaPointe, P.C.

[57] ABSTRACT

A memory used for both a field configurable RAM and a PLA, comprising a configurable memory block including a CAM block for performing an AND function of the PLA and a RAM block for selectively performing a field configurable RAM function and an OR function of the PLA, each of the CAM and RAM blocks including a plurality of basic memory blocks, each of the basic memory blocks including a plurality of CAM cells, a plurality of interconnection circuits for selectively interconnecting the basic memory blocks, an input controller for controlling a data input operation of the configurable memory block, and an output controller for controlling a data output operation of the configurable memory block. According to the present invention, the length of output data or the number of memory blocks can be adjusted with no loss in area.

4 Claims, 6 Drawing Sheets

Prior Art

CAM CELL AND MEMORY EMPLOYING SUCH, USED FOR BOTH FIELD CONFIGURABLE RAM AND PLA

BACKGROUND OF THE INVENTION

1. Field of the Invention

The present invention relates to a content addressable memory (CAM) cell and a memory (referred to hereinafter as "FCMPLA") employing such, which is used for both a field configurable random access memory (RAM) and a programmable logic array (PLA) and has a memory configuration changeable according to a user's intention.

2. Description of the Prior Art

Recently proposed as application specific integrated circuit (ASIC) techniques have been a programmable logic device (PLD), field programmable gate array (FPGA), gate array, standard cell, custom IC design, etc..

Among them, the PLD and FPGA are programmable by the user. Recently, a field configurable memory (FCM) using a static random access memory (SRAM) has been developed for improvement in the performance of the FPGA (see: Tony Ngai, "An SRAM-Programmable Field-Configurable Memory", IEEE Custom Integrated Circuits Conference, pp 499–502, 1995).

However, the above-mentioned FCM is disadvantageous in that it cannot variously change the length of output data and has no programmable logic array function.

On the other hand, a PLA has been used for the implementation of a combinational logic circuit (may be included, for example, in a state machine) with a large number of inputs.

A CAM has been used for the implementation of a memory usable for both the PLA and RAM (see: Memory device that functions as a content addressable memory or random access memory, U.S. Pat. No. 5,408,434, 1994. 2. 3).

However, the above-mentioned memory usable for both the PLA and RAM is disadvantageous in that it has no memory configuration changeable according to a user's intention and requires a separate circuit for interconnection between blocks.

The CAM functions to compare data to be processed, with contents therein to search for a matched address, and a cell construction thereof is schematically shown in FIG. 1 herein.

With reference to FIG. 1, a conventional CAM cell 100 comprises a word line 101 which is applied with current or voltage to drive a selected word. A storage device is provided with load elements Q3 and Q4, drive elements Q1 and Q2, and access elements Q5, Q6, Q7 and Q8 constituting a transfer gate which functions as a data input/output path to the memory cell. An element Q9 is adapted to compare input data on a data line with data stored in the storage device. If the input data on the data line is the same as the data stored in the storage device, then the element Q9 is turned on. A match line 102 is operated when the element Q9 is turned on.

The operation of the CAM cell 100 with the above-mentioned construction is classified into a RAM operation as a general memory function of storing and outputting data, and a matching operation as its self-function.

A common read/write terminal must be provided in the CAM cell 100 for execution of the RAM operation of reading and writing data from/into the cell. Here, the data line is used for the data read/write operations.

The procedure of storing data in the CAM cell 100 under the condition that no data is stored therein will hereinafter be described.

First, current or voltage is applied to the word line 101 to make it high in logic, thereby causing the access elements Q5 and Q6 to be turned on. Then, if high logic input data is provided on the data line, the elements Q1 and Q4 are turned on and the elements Q2 and Q3 are turned off. As a result, a low logic value appears at a node N1 of the storage device, and a high logic value appears at a node N2 of the storage device. In this manner, the input data is stored in the CAM cell 100.

The procedure of reading data from the CAM cell 100 under the condition that a high logic value is stored at the node N2 of the storage device will hereinafter be described.

First, current or voltage is applied to the word line 101 to make it high in logic, thereby causing the access elements Q5, Q6 and Q8 to be turned on. At this time, no current flows to the element Q8 because no input data is provided on the data line. Then, the high logic value at the node N2 is transferred to the data line through the access element Q6. As a result, the high logic value at the node N2 is outputted over the data line.

The self-function or matching operation of the CAM cell 100 will hereinafter be described.

In the case where a high logic value is stored at the node N1 of the storage device, the access element Q7 remains off and the access element Q8 remains on. Under this condition, if high logic input data is provided on the data line, the element Q9 is turned on because the input data is the same as the stored data. As a result, the match line 102 is operated.

FIG. 2 shows a basic memory block which essentially comprises the CAM cells 100 with the above-mentioned construction and operation. Main input/output lines of the basic memory block are classified into three types, or a word line used for the RAM operation, a match line used for the CAM operation, and a data line used for the data input/output operations.

Interconnection circuits 200 are provided for the interconnection between basic memory blocks. As shown, each of the interconnection circuits 200 includes path transistors 202 and drivers 201. The path transistor 202 is determined in connection according to a classification and function of the associated basic memory block, which is enabled by a gate voltage.

As a result, a voltage is transferred from a cell in one basic memory block to that in the subsequent basic memory block through the electrical connection between the blocks.

The driver 201 is a circuit or amplifier which is used to remove an effect of the preceding stage. Also, the driver 201 enables the match line 102 derived from the CAM cell 100 to drive the word line 101 of the RAM. Further, the driver 201 is adapted to compensate for a voltage drop and speed reduction by the path transistor 202.

However, in the interconnection between the basic memory blocks with the conventional CAM cells, the path transistor 202 provided at the preceding stage of the driver 201 causes a voltage drop, resulting in a degradation in drive capability. Further, a large number of path transistors 202 are required.

Furthermore, the above-mentioned conventional techniques have a disadvantage in that a data width or the number of memory blocks cannot be adjusted according to a user's intention or no PLA function is present. Even though the PLA function is present, a large number of interconnection blocks must be provided, resulting in drawbacks in area and speed.

SUMMARY OF THE INVENTION

Therefore, the present invention has been made in view of the above problems, and it is an object of the present invention to provide a CAM cell and an FCMPLA employing such, which is used for both a field configurable RAM and a PLA and has a memory configuration which is changeable according to a user's intention to adjust the length of output data.

In accordance with one aspect of the present invention, there is provided a CAM cell comprising storage means for storing desired data therein; a data line for inputting and outputting the desired data; an inverted data line for inputting and outputting an inverted one of the desired data; a word line for driving a selected word; a match line connected directly to the word line; a first NMOS transistor having its gate connected to a data input/output node of the storage means and its one side connected to the inverted data line; a second NMOS transistor having its gate connected to an inverted data input/output node of the storage means, its one side connected to the data line and its other side connected to the other side of the first NMOS transistor; a third NMOS transistor having its gate connected in common to the other sides of the first and second NMOS transistors and its one side connected to the match line; and a fourth NMOS transistor having its gate for inputting a CAM-on/off control signal, its one side connected to the other side of the third NMOS transistor and its other side connected to a ground voltage terminal.

In accordance with another aspect of the present invention, there is provided a memory used for both a field configurable RAM and a PLA, comprising a configurable memory block including a CAM block for performing an AND function of the PLA, and a RAM block for selectively performing a field configurable RAM function and an OR function of the PLA, each of the CAM and RAM blocks including a plurality of basic memory blocks, each of the basic memory blocks including a plurality of CAM cells; a plurality of interconnection circuits for selectively interconnecting the basic memory blocks; an input controller for controlling a data input operation of the configurable memory block; and an output controller for controlling a data output operation of the configurable memory block.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
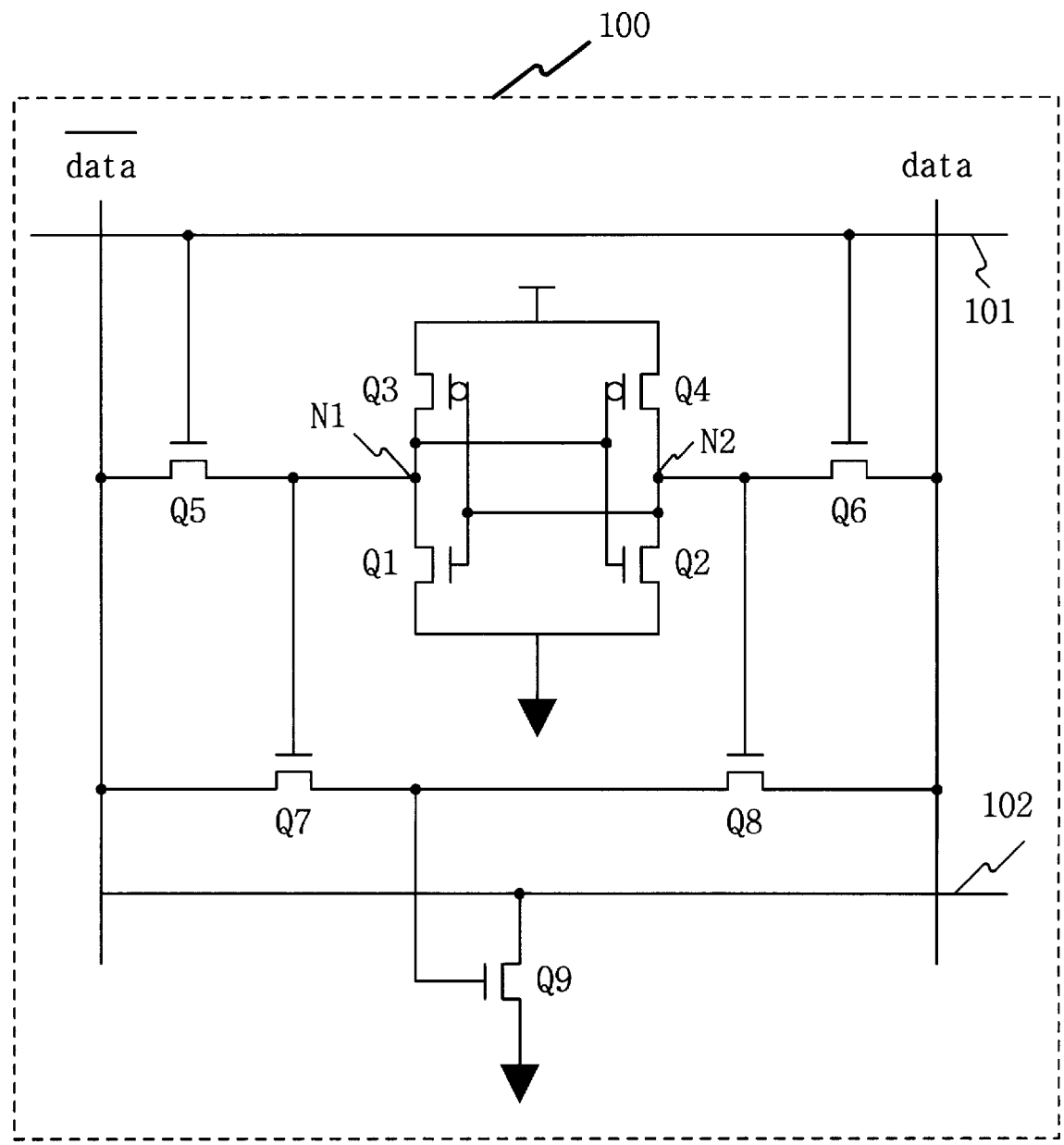
FIG. 1 is a circuit diagram illustrating the construction of a conventional CAM cell.
Figure 2:
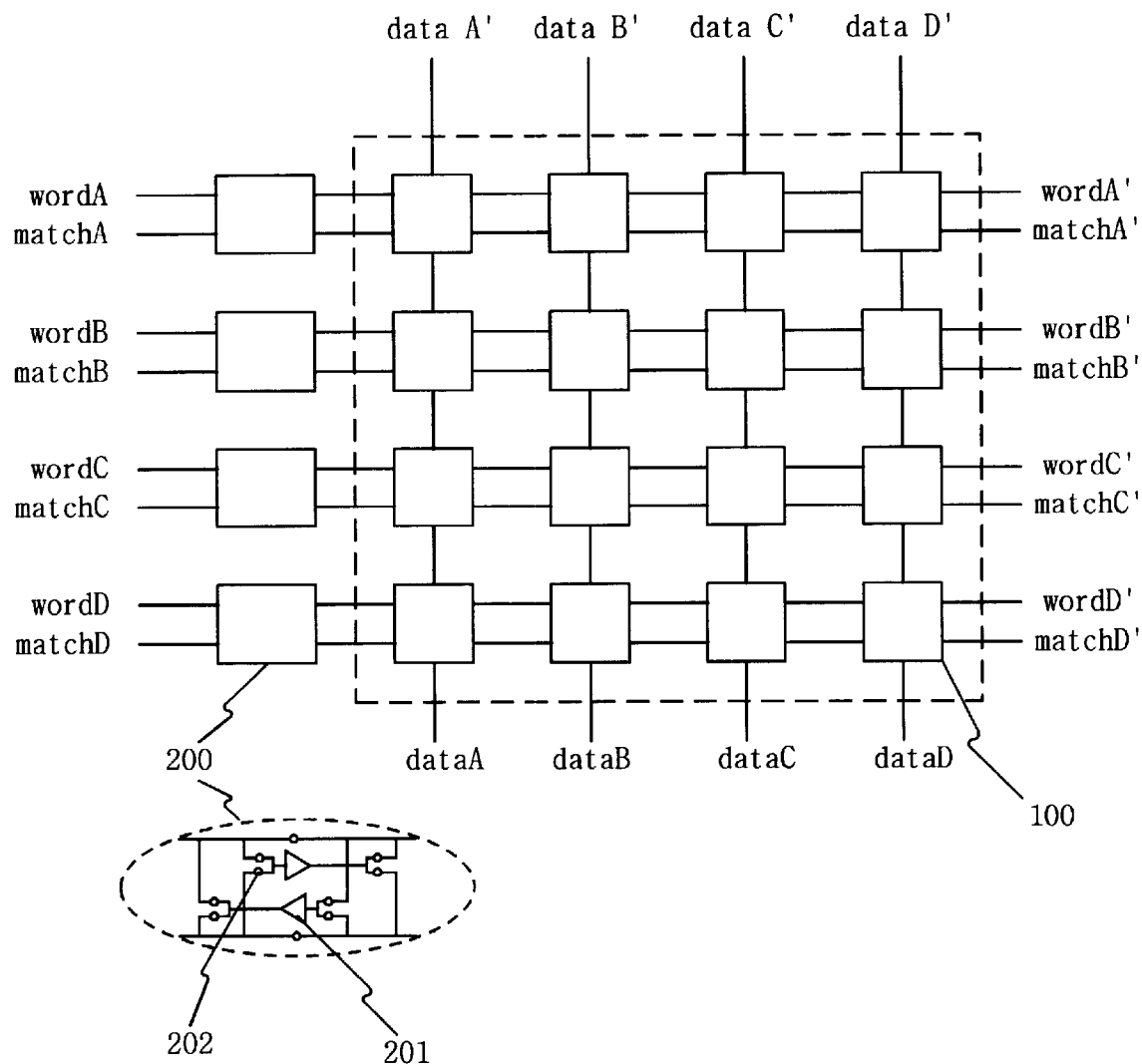
FIG. 2 is a block diagram illustrating the construction of a basic memory block using the conventional CAM cell in FIG. 1.
Figure 3:
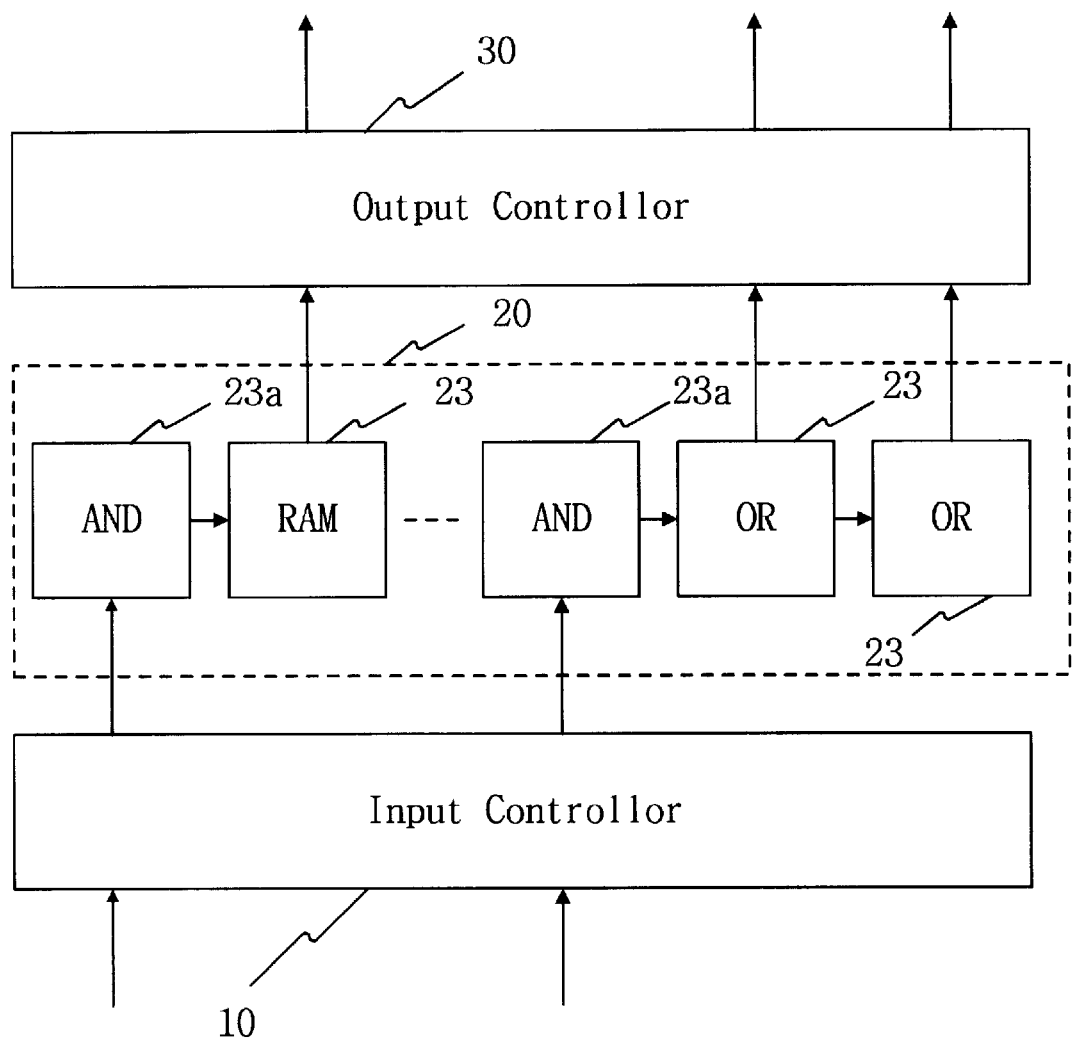
FIG. 3 is a block diagram illustrating the construction of an FCMPLA employing a CAM cell in accordance with the present invention, which is used for both a field configurable RAM and a PLA.
Figure 4:
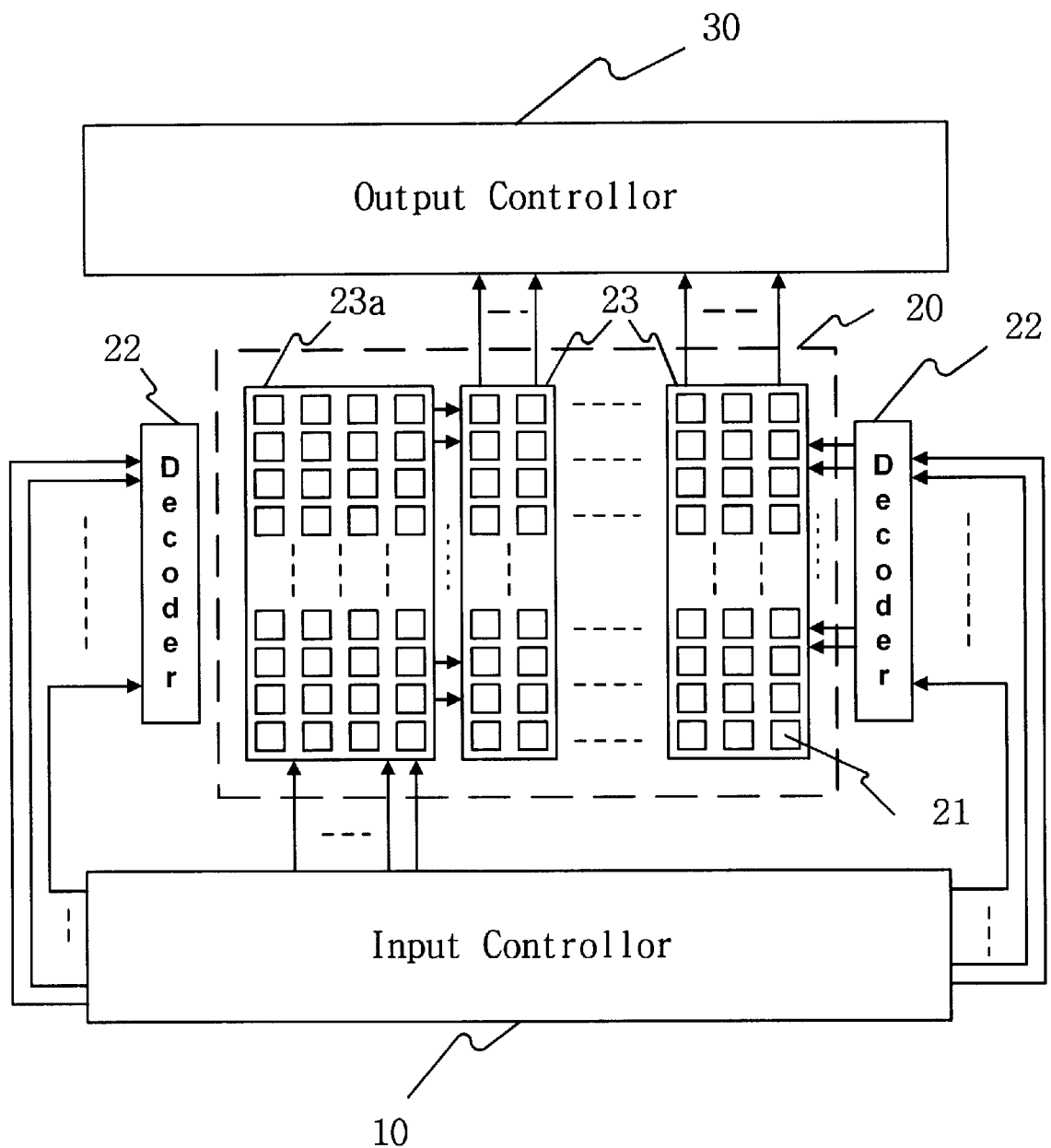
FIG. 4 is a detailed block diagram of the FCMPLA in FIG. 3.

FIG. 3 is a block diagram illustrating the construction of an FCMPLA employing a CAM cell in accordance with the present invention, which is used for both a field configurable RAM and a PLA, and FIG. 4 is a detailed block diagram of the FCMPLA in FIG. 3. As shown in these drawings, the FCMPLA basically comprises a configurable memory block 20, an input controller 10 and an output controller 30.

The configurable memory block 20 is provided with a plurality of basic memory blocks 21, each including k×k-byte CAM cells 24, which will be mentioned later in detail with reference to FIG. 5. Noticeably, the configurable memory block 20 is determined in function according to a connection and configuration of the basic memory blocks 21 therein.

Accordingly, the configurable memory block 20 can be used as the field configurable RAM and AND/OR planes of the PLA.

The operation of the FCMPLA with the above-mentioned construction in accordance with the present invention will hereinafter be described in detail.

First, if inputs are distributed to the AND planes of the PLA in the configurable memory block 20 by the input controller 10, then outputs are provided by the OR planes of the PLA and a RAM block in the configurable memory block 20. The output controller 30 provides the final output by further varying a memory depth.

Noticeably, the AND planes of the PLA may be used as the field configurable RAM. In this case, however, the usable memory amount is reduced. For this reason, there are provided separate fixed decoders 22 which can further be used for the parallel loading to initialize the contents stored in the memory.

The fixed decoders 22 are disposed around the configurable memory block 20 to establish a bidirectionality. Namely, the fixed decoders 22 are not present respectively at sub blocks in the configurable memory block 20, but shared by them. As a result, the length of output data can be increased readily with no loss in area.

The RAM block is also used to implement the OR planes of the PLA to reduce an area occupied by the match lines.

In more detail, the FCMPLA of the present invention basically comprises the configurable memory block 20, which consists of a CAM block 23a and a RAM block 23. The CAM block 23a is used for the decoding of the field configurable RAM and the AND planes of the PLA, and the RAM block 23 is used for the field configurable RAM and the OR planes of the PLA. The selection of the CAM and RAM blocks is determined according to CAM-on/off terminals of the CAM cells. The fixed decoders 22 are disposed at both sides of the configurable memory block 20 so that word and match signals can bidirectionally be transferred.

The plurality of basic memory blocks 21 can constitute the configurable memory block 20 according to a user's intention. This enables a variation in the length of output data.

Figure 5:
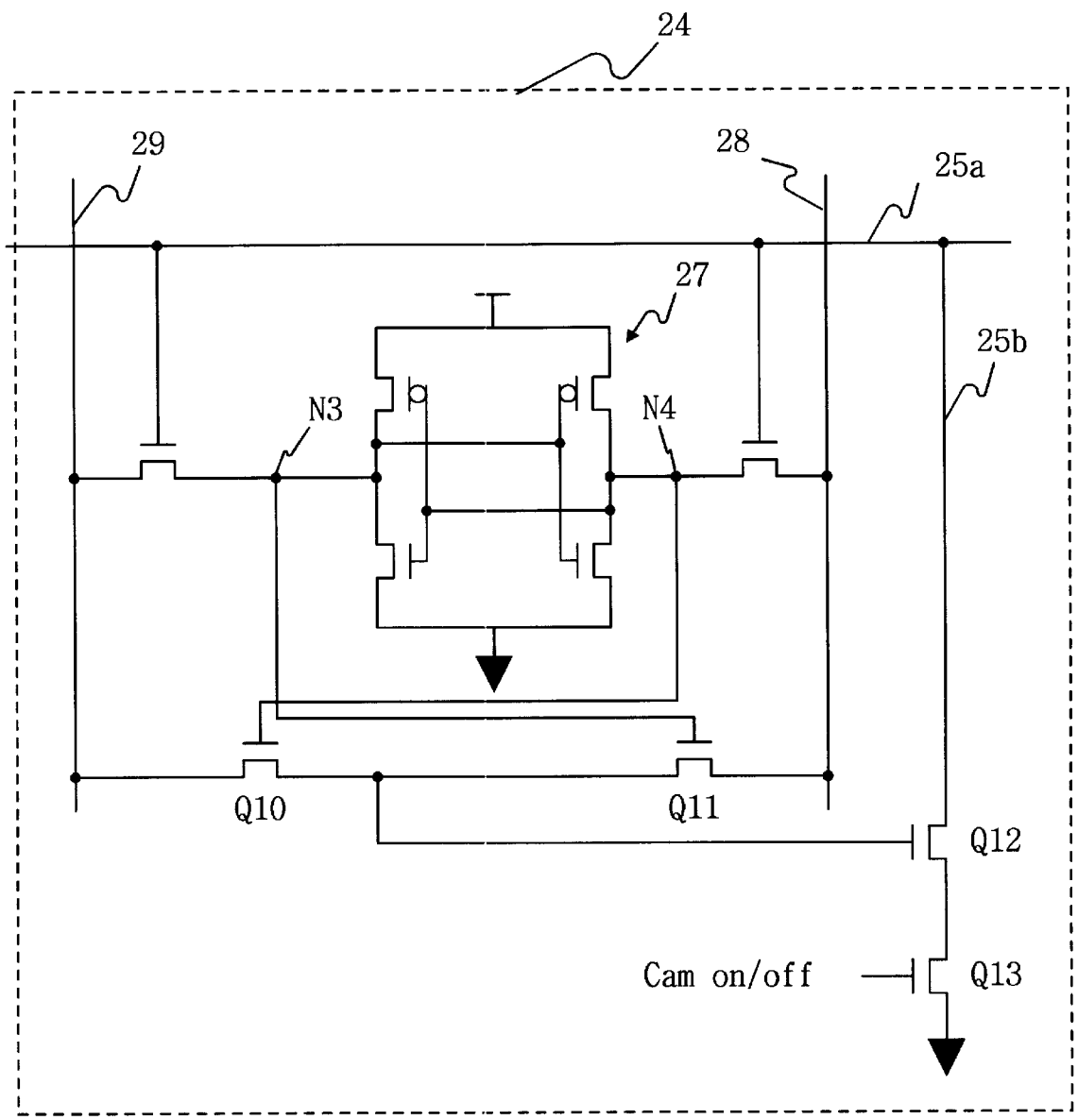
FIG. 5 is a circuit diagram illustrating the construction of a CAM cell in accordance with the present invention.

FIG. 5 is a circuit diagram illustrating the construction of the CAM cell 24 in accordance with the present invention. As shown in this drawing, the CAM cell 24 comprises a storage device 27 for storing desired data therein, a data line 28 for inputting and outputting the desired data, an inverted data line 29 for inputting and outputting an inverted one of the desired data, a word line 25a for driving a selected word, and a match line 25b connected directly to the word line 25a.

A first NMOS transistor Q10 has its gate connected to a data input/output node N4 of the storage device 27 and its one side connected to the inverted data line 29. A second NMOS transistor Q11 has its gate connected to an inverted data input/output node N3 of the storage device 27, its one side connected to the data line 28 and its other side connected to the other side of the first NMOS transistor Q10. A third NMOS transistor Q12 has its gate connected in common to the other sides of the first and second NMOS transistors Q10 and Q11 and its one side connected to the match line 25b. A fourth NMOS transistor Q13 has its gate for inputting a CAM-on/off control signal, its one side connected to the other side of the third NMOS transistor Q12 and its other side connected to a ground voltage terminal.

In a feature of the CAM cell 24, a match signal is generated only when input data is the same as stored data. Therefore, even if the word line 25a goes high in logic, the stored data is subjected to no damage.

The operation of the CAM cell 24 with the above-mentioned construction in accordance with the present invention will hereinafter be described in detail. Here, a general RAM operation of storing and outputting data is the same as that of the conventional CAM cell, and a description thereof will thus be omitted.

In a matching operation of the CAM cell 24, if a high logic value is stored at the data input/output node N4 of the storage device 27 and a low logic value is stored at the inverted data input/output node N3 of the storage device 27, the first NMOS transistor Q10 is turned on and the second NMOS transistor Q11 is turned off. Under this condition, if high logic input data is provided on the data line 28, a low logic value on the inverted data line 29 is transferred to the gate of the third NMOS transistor Q12 through the first NMOS transistor Q10. Thus, the third NMOS transistor Q12 is turned off to maintain the match line 25b at a high logic state.

To the contrary, in the case where a low logic value is stored at the data input/output node N4 of the storage device 27 and a high logic value is stored at the inverted data input/output node N3 of the storage device 27, the first NMOS transistor Q10 is turned off and the second NMOS transistor Q11 is turned on. Under this condition, if low logic input data is provided on the data line 28, then it is transferred to the gate of the third NMOS transistor Q12 through the second NMOS transistor Q11. As a result, the third NMOS transistor Q12 is turned off to maintain the match line 25b at a high logic state.

On the other hand, if a high logic value is stored at the data input/output node N4 of the storage device 27 and a low logic value is stored at the inverted data input/output node N3 of the storage device 27, the first NMOS transistor Q10 is turned on and the second NMOS transistor Q11 is turned off. Under this condition, if low logic input data is provided on the data line 28, a high logic value on the inverted data line 29 is transferred to the gate of the third NMOS transistor Q12 through the first NMOS transistor Q10, thereby causing the third NMOS transistor Q12 to be turned on. At this time, the CAM-on/off control signal is high in logic to indicate a CAM-on state. As a result, the fourth NMOS transistor Q13 is turned on, too, thereby causing the match line 25b to go low in logic.

In the case where the CAM-on/off control signal is low in logic to indicate a CAM-off state, the fourth NMOS transistor Q13 is maintained at a high impedance state, which has no effect on the RAM operation.

Figure 6:
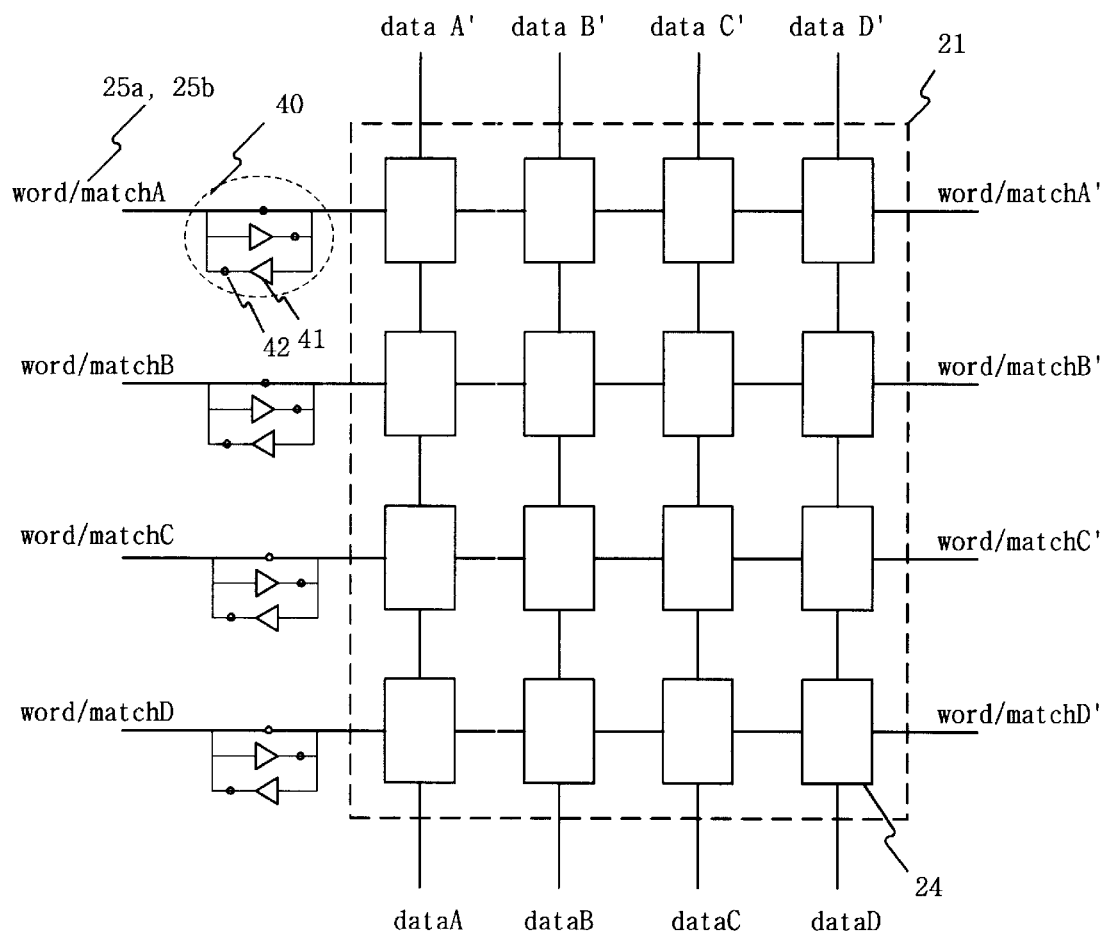
FIG. 6 is a block diagram illustrating the construction of a basic memory block using the CAM cell in FIG. 5.

FIG. 6 is a block diagram illustrating the construction of the basic memory block 21 using the CAM cell 24 in FIG. 5. As shown in this drawing, because the word line 25a and the match line 25b are shared in the CAM cell 24, an interconnection circuit 40 can be provided with a smaller number of path transistors 42. Further, a voltage drop and speed reduction by the path transistor 42 can be minimized.

As apparent from the above description, according to the present invention, the FCMPLA employing the CAM cell can be used for both the field configurable RAM and PLA, and the memory configuration thereof is changeable according to a user's intention in the field. Therefore, the present invention enables the configuration of a large capacity memory of several thousands to tens of thousands bytes. Further, the sharing of the word line and match line in the CAM cell has the effect of improving drawbacks in area and speed of the interconnection circuit.

Furthermore, the CAM cell of the present invention can be used as the fundamental construction of an ASIC technique in which the interconnection is important, such as, for example, an FPGA.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A CAM cell comprising:

storage means for storing desired data therein;

a data line for inputting and outputting said desired data;

an inverted data line for inputting and outputting an inverted one of said desired data;

a word line for driving a selected word;

a match line connected directly to said word line;

a first NMOS transistor having its gate connected to a data input/output node of said storage means and its one side connected to said inverted data line;

a second NMOS transistor having its gate connected to an inverted data input/output node of said storage means, its one side connected to said data line and its other side connected to the other side of said first NMOS transistor;

a third NMOS transistor having its gate connected in common to said other sides of said first and second NMOS transistors and its one side connected to said match line; and a fourth NMOS transistor having its gate for inputting a CAM-on/off control signal, its one side connected to the other side of said third NMOS transistor and its other side connected to a ground voltage terminal.

2. A memory used for both a field configurable RAM and a PLA, comprising:

a configurable memory block including a CAM block for performing an AND function of said PLA, and a RAM block for selectively performing a field configurable RAM function and an OR function of said PLA, each of said CAM and RAM blocks including a plurality of basic memory blocks, each of said basic memory blocks including a plurality of CAM cells;

a plurality of interconnection circuits for selectively interconnecting said basic memory blocks;

an input controller for controlling a data input operation of said configurable memory block; and an output controller for controlling a data output operation of said configurable memory block, wherein each of said CAM cells includes:
  storage means for storing desired data therein;
  a data line for inputting and outputting said desired data;
  an inverted data line for inputting and outputting an inverted one of said desired data;
  a word line for driving a selected word;
  a match line connected directly to said word line;
  a first NMOS transistor having its gate connected to a data input/output node of said storage means and its one side connected to said inverted data line;
  a second NMOS transistor having its gate connected to an inverted data input/output node of said storage means, its one side connected to said data line and its other side connected to the other side of said first NMOS transistor;
  a third NMOS transistor having its gate connected in common to said other sides of said first and second NMOS transistors and its one side connected to said match line; and
  a fourth NMOS transistor having its gate for inputting a CAM-on/off control signal, its one side connected to the other side of said third NMOS transistor and its other side connected to a ground voltage terminal.

3. A memory used for both a field configurable RAM and a PLA, comprising:
  1) a configurable memory block including:
    a) a CAM block for performing an AND function of said PLA,
    b) a RAM block for selectively performing a field configurable RAM function and an OR function of said PLA,
  each of said CAM and RAM blocks including a plurality of basic memory blocks,
  each of said basic memory blocks including a plurality of CAM cells including,
    storage means for storing desired data therein;
    a data line for inputting and outputting said desired data;
    an inverted data line for inputting and outputting an inverted one of said desired data;
    a word line for driving a selected word;
    a match line connected directly to said word line;
    a first NMOS transistor having its gate connected to a data input/output node of said storage means and its one side connected to said inverted data line;
    a second NMOS transistor having its gate connected to an inverted data input/output node of said storage means, its one side connected to said data line and its other side connected to the other side of said first NMOS transistor;
    a third NMOS transistor having its gate connected in common to said other sides of said first and second NMOS transistors and its one side connected to said match line; and
    a fourth AMOS transistor having its gate for inputting a CAM-on/off control signal, its one side connected to the other side of said third AMOS transistor and its other side connected to a ground voltage terminal,
  2) a plurality of interconnection circuits for selectively interconnecting said basic memory blocks,
  3) an input controller for controlling a data input operation of said configurable memory block, and
  4) an output controller for controlling a data output operation of said configurable memory block.

4. A memory used for both a field configurable RAM and a PLA, as set forth in claim 3, further comprising a pair of decoders disposed at both sides of said RAM block in said configurable memory block, for cooperating with said RAM block to perform said OR function of said PLA.

* * * * *